(12) United States Patent
Hendry

(10) Patent No.: US 9,882,482 B1
(45) Date of Patent: Jan. 30, 2018

(54) CURRENT SENSE CIRCUIT WITH ADAPTIVE COMMON MODE VOLTAGE ADJUST AND ASSOCIATED METHOD THEREOF

(71) Applicant: Monolithic Power Systems, Inc., San Jose, CA (US)

(72) Inventor: Ivor Hendry, Cary, NC (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 15/267,123

(22) Filed: Sep. 15, 2016

(51) Int. Cl.
*H02M 3/158* (2006.01)
*H02M 1/08* (2006.01)
*G01R 19/10* (2006.01)
*G01R 19/165* (2006.01)
*H02M 3/156* (2006.01)
*H02M 1/00* (2006.01)

(52) U.S. Cl.
CPC ............ *H02M 3/158* (2013.01); *G01R 19/10* (2013.01); *G01R 19/16576* (2013.01); *H02M 1/08* (2013.01); *H02M 3/156* (2013.01); *H02M 3/1588* (2013.01); *H02M 2001/0009* (2013.01)

(58) Field of Classification Search
CPC ............................ H02M 3/158; H02M 3/158
See application file for complete search history.

(56) References Cited

U.S. PATENT DOCUMENTS

| | | | |
|---|---|---|---|
| 7,102,335 B1* | 9/2006 | Solie | G11C 5/141 323/273 |
| 9,241,381 B2 | 1/2016 | Lin | |
| 2006/0261884 A1* | 11/2006 | Gammie | H03F 3/45192 330/9 |
| 2016/0172999 A1 | 6/2016 | John | |

OTHER PUBLICATIONS

U.S. Appl. No. 14/788,361, filed Jun. 30, 2015, Yike.

* cited by examiner

*Primary Examiner* — Jue Zhang
*Assistant Examiner* — Trinh Dang
(74) *Attorney, Agent, or Firm* — Perkins Coie LLP

(57) ABSTRACT

A current sense circuit for sensing a target current flowing through a sensing resistor, has a first operational amplifier, a first transistor and a common mode adjust circuit. The first operational amplifier has a first input terminal coupled to a positive terminal of the sensing resistor, a second input terminal coupled to a negative terminal of the sensing resistor, and an output terminal. The first transistor has a first terminal coupled to the first input terminal of the first operational amplifier, a second terminal configured to provide a first output voltage in responsive to the target current, and a control terminal coupled to the output terminal of the first operational amplifier. The common mode adjust circuit adaptively adjusts a common mode voltage of the first operational amplifier.

18 Claims, 5 Drawing Sheets

CURRENT SENSE CIRCUIT WITH ADAPTIVE COMMON MODE VOLTAGE ADJUST AND ASSOCIATED METHOD THEREOF

TECHNICAL FIELD

The present invention relates to electrical circuit, more particularly but not exclusively relates to current sense circuit.

BACKGROUND

Current sensing is a critical aspect of today's power management, which is necessary for precision closed-loop control and circuit protection. Traditionally, there are two basic schemes for current sensing, measuring a magnetic field around a current-carrying inductor, or measuring a voltage drop across a sensing resistor. However, a magnetic field measuring circuit is expensive and not that easy to be integrated. And a voltage drop measuring circuit usually employs a precision amplifier to amplify the voltage drop across the sensing resistor which is inserted in a current path. The sensing resistor should have a low resistance, e.g., 1 mohm, for lower power dissipation requirement, so the voltage across the sensing resistor is small, and it is a challenge to provide a precision sensing result while withstanding a common mode voltage having a large range, e.g., the common mode voltage may be as high as 60V, and as low as 0V.

SUMMARY

It is one of the objects of the present invention to provide a current sense circuit and a current sensing method to solve the above problems.

One embodiment of the present invention discloses a current sense circuit for sensing a target current flowing through a sensing resistor, wherein the sensing resistor having a positive terminal and a negative terminal, the current sense circuit comprising: a first operational amplifier, having a first input terminal, a second input terminal and an output terminal, wherein the first input terminal is coupled to the positive terminal of the sensing resistor, and the second input terminal is coupled to the negative terminal of the sensing resistor, and wherein the first input terminal and the second input terminal of the first operational amplifier has a common mode voltage with respect to a reference ground; a first transistor, having a first terminal, a second terminal and a control terminal, wherein the control terminal is coupled to the output terminal of the first operational amplifier, the first terminal is coupled to the first input terminal of the first operational amplifier, and the second terminal is coupled to the reference ground through a first resistor, wherein the first transistor is configured to provide a first output voltage across the first resistor in response to the target current; and a common mode adjust circuit, having an input terminal, a first output terminal and a second output terminal, wherein the input terminal is coupled to the output terminal of the first operational amplifier and the control terminal of the first transistor, the first output terminal is coupled to the first input terminal of the first operational amplifier, and the second output terminal is coupled to the second input terminal of the first operational amplifier, wherein the common mode adjust circuit is configured to adaptively adjust the common mode voltage.

Another embodiment of the present invention discloses a switching circuit having an input port and an output port, wherein the output port is configured to provide a switcher output voltage, the switching circuit comprising: a switch, coupled between the input port and the output port, and the switch is configured to be turned ON and turned OFF to regulate the switcher output voltage; a sensing resistor, having a positive terminal and a negative terminal, wherein the positive terminal is coupled to the switch, and the negative terminal is coupled to the output port, a target current flows through the sensing resistor from the positive terminal to the negative terminal; and a current sense circuit, having a first input port, a second input port and an output port, wherein the first input port is coupled to the positive terminal of the sensing resistor, the second input port is coupled to the negative terminal of the sensing resistor, and the current sense circuit is configured to amplify a differential voltage across the sensing resistor and provide an output voltage at the output port of the current sense circuit in response to the target current, wherein the first input port and the second input port of the current sense circuit has a common mode voltage with respect to a reference ground, and wherein the current sense circuit is configured to adaptively adjust the common mode voltage based on the switcher output voltage.

Yet another embodiment of the present invention discloses a method for sensing a target current flowing through a sensing resistor, wherein the sensing resistor has a positive terminal and a negative terminal, the method comprising: sensing a differential voltage across the sensing resistor by a first operational amplifier, the first operational amplifier having a first input terminal coupled to the positive terminal of the sensing resistor, a second input terminal coupled to the negative terminal of the sensing resistor, and an output terminal, wherein the first input terminal and the second input terminal of the first operational amplifier has a common mode voltage with respect to a reference ground; coupling a first transistor to the first operational amplifier, the first transistor having a control terminal, a first terminal and a second terminal, wherein the control terminal is coupled to the output terminal of the first operational amplifier, and the first terminal is coupled to the first input terminal of the first operational amplifier; providing an output voltage at the second terminal of the first transistor in response to the target current; and adaptively adjusting the common mode voltage when a voltage at the negative terminal of the sensing resistor is lower than a minimum common mode voltage, wherein the minimum common mode voltage varies with the differential voltage across the sensing resistor.

The presented current sense circuit employs a common mode adjust circuit to adaptively adjust a common mode voltage when needed.

BRIEF DESCRIPTION OF THE DRAWINGS

Non-limiting and non-exhaustive embodiments are described with reference to the following drawings.

The use of the same reference label in different drawings indicates the same or like components.

DETAILED DESCRIPTION

In the present application, numerous specific details are provided, such as examples of circuits, components, and methods, to provide a thorough understanding of embodiments of the invention. These embodiments are exemplary, not to confine the scope of the invention. Persons of ordinary skill in the art will recognize, however, that the invention can be practiced without one or more of the specific details. In other instances, well-known details are not shown or described to avoid obscuring aspects of the invention. Some phrases are used in some exemplary embodiments. However, the usage of these phrases is not confined to these embodiments.

Several embodiments of the present invention are described below with reference to switching converter and associated discharging method. As used hereinafter, the term "couple" generally refers to multiple ways including a direct connection with an electrical conductor and an indirect connection through intermediaries, such as resistors.

Figure 1:
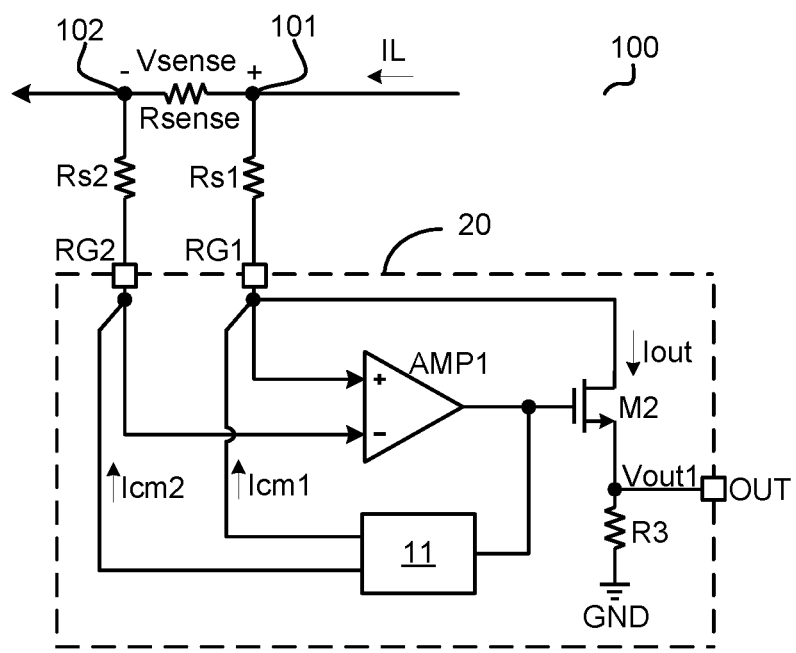
FIG. 1 illustrates a circuit block diagram of a circuit 100 according to an embodiment of the present invention.

FIG. 1 illustrates a circuit block diagram of a circuit 100 according to an embodiment of the present invention. Circuit 100 comprises a sensing resistor Rsense and a current sense circuit 20. Sensing resistor Rsense having a positive terminal 101 and a negative terminal 102 is inserted into a current path to sense a target current IL. Target current IL flows from positive terminal 101 to negative terminal 102. Current sense circuit 20 has an input port RG1, an input port RG2 and an output port OUT, wherein input port RG1 is coupled to positive terminal 101 of sensing resistor Rsense through a resistor Rs1, input port RG2 is coupled to negative terminal 102 of sensing resistor Rsense through a resistor Rs2, and current sense circuit 20 amplifies a differential voltage Vsense across sensing resistor Rsense and provides an output voltage Vout1 at output port OUT in response to target current IL.

Current sense circuit 20 comprises an operational amplifier AMP1, a common mode adjust circuit 11, and a transistor M2. Operational amplifier AMP1 has a non-inverting terminal, an inverting terminal and an output terminal, wherein the non-inverting terminal of operational amplifier AMP1 is coupled to positive terminal 101 of sensing resistor Rsense through input port RG1 and a resistor Rs1, and the inverting terminal of operational amplifier AMP1 is coupled to negative terminal 102 of sensing resistor Rsense through input port RG2 and a resistor Rs2. A transistor M2 has a control terminal, a first terminal and a second terminal, wherein the control terminal of transistor M2 is coupled to the output terminal of operational amplifier AMP1, the first terminal of transistor M2 is coupled to input port RG1 and the non-inverting terminal of operational amplifier AMP1, the second terminal of transistor M2 is coupled to a reference ground GND through a resistor R3. A current Iout flows through the first terminal to the second terminal of transistor M2, and transistor M2 is configured to provide output voltage Vout1 across resistor R3. Current sense circuit 20 has a common mode voltage VCM with respect to reference ground GND at input port RG1 and input port RG2. In other words, the non-inverting terminal and the inverting terminal of operational amplifier AMP1 has common mode voltage VCM with respect to reference ground GND.

Continuing with FIG. 1, ideally, output voltage Vout1 is expressed as:

$$Vout1 = R3*IL*Rsense/Rs1 \quad (1)$$

Where IL*Rsense is Vsense, and a magnification of current sense circuit 20 is Vout1/Vsense, which equals R3/Rs1. Since when transistor M2 is fully turned ON, a voltage at the first terminal of transistor M2 cannot be lower than output voltage Vout1. As a result, when common mode voltage VCM is too low to regulate transistor M2 normally, current sense circuit 20 cannot provide proper output voltage Vout1 to indicate target current IL correctly.

Common mode adjust circuit 11 is employed to adjust common mode voltage VCM adaptively until there is sufficient headroom on transistor M2 to regulate output voltage Vout1. And when having sufficient headroom, transistor M2 can be normally regulated, a voltage at the first terminal of transistor M2 is larger than a voltage at the second terminal of transistor M2. In one embodiment, common mode adjust circuit 11 has an input terminal, a first output terminal, and a second output terminal, wherein the input terminal is coupled to the output terminal of operational amplifier AMP1 and the control terminal of transistor M2, the first output terminal is coupled to input port RG1 and the non-inverting terminal of operational amplifier AMP1, and the second output terminal is coupled to input port RG2 and the inverting terminal of operational amplifier AMP1. In one embodiment, common mode adjust circuit 11 is configured to lift common mode voltage VCM until transistor M2 can be normally regulated by providing an adjusting current Icm1 at its first output terminal and an adjusting current Icm2 at its second output terminal when a voltage at positive terminal 101 of sensing resistor Rsense or a voltage at negative terminal 102 of sensing resistor Rsense is lower than a minimum common mode voltage VCMmin; otherwise when the voltage at positive terminal 101 or the voltage at negative terminal 102 is higher than minimum common mode voltage VCMmin, common mode adjust circuit 11 will not adjust common mode voltage VCM which approximately equals a voltage at negative terminal 102 of sensing resistor Rsense, and both adjusting current Icm1 and adjusting current Icm2 are zero. In one embodiment, minimum common mode voltage VCMmin is responsive to a voltage across resistor R3 when transistor M2 is normally regulated.

In one embodiment, transistor M2 is a field effect transistor (FET), wherein the control terminal is a Gate, the first terminal is a Drain, and the second terminal is a Source.

In one embodiment, current sense circuit 20 is integrated on an integrated circuit (IC). In another embodiment, current sense circuit 20 is integrated with other circuits.

Figure 2:
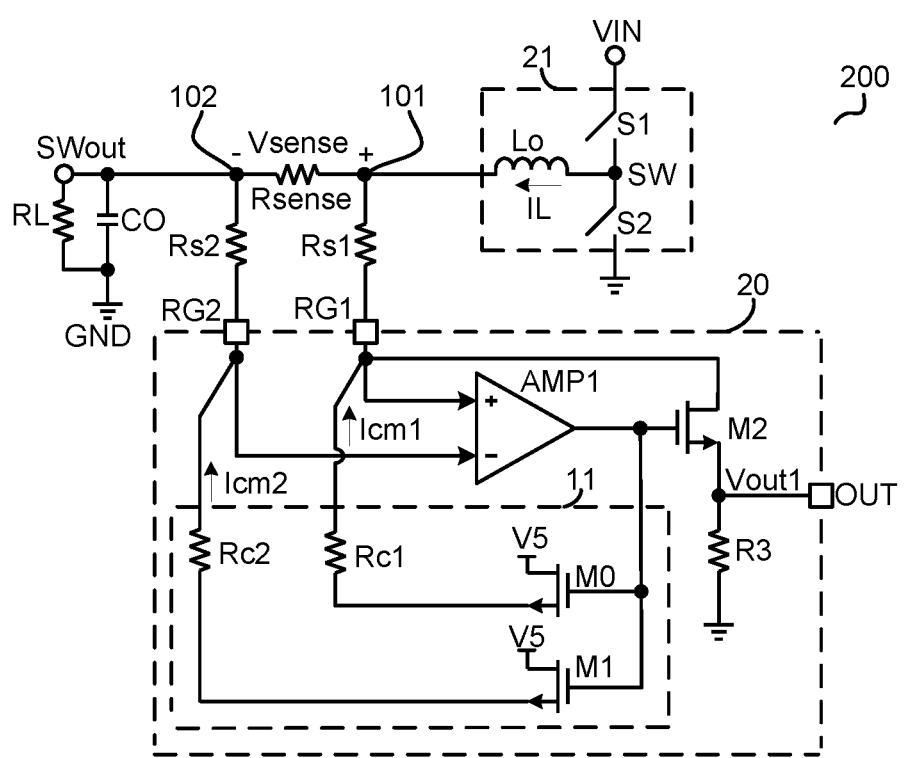
FIG. 2 schematically illustrates a switching circuit 200 according to an embodiment of the present invention.

FIG. 2 schematically illustrates a switching circuit 200 according to an embodiment of the present invention. Switching circuit 200 has an input port to receive an input voltage VIN, and an output port to provide a switcher output voltage SWout. As shown in FIG. 2, switching circuit 200 has a power stage 21, sensing resistor Rsense, and current sense circuit 20. Power stage 21 has at least one switch coupled between the input port and the output port of switching circuit 200, and the at least one switch is configured to be turned ON and turned OFF to regulate switcher output voltage SWout. In the embodiment show in FIG. 2 as one example, power stage 21 has an inductor Lo, and a switch S1 and a switch S2 coupled in series between the input port of switching circuit 200 and reference ground GND. Inductor Lo has a first terminal coupled to a common node SW of switch S1 and switch S2, and a second terminal coupled to positive terminal 101 of sensing resistor Rsense.

Negative terminal 102 of sensing resistor Rsense is coupled to the output port of switching circuit 200. Target current IL flows through sensing resistor Rsense from positive terminal 101 to negative terminal 102. In one embodiment, an output capacitor CO and a load resistor RL is coupled in parallel between the output port of switching circuit 200 and reference ground GND.

In the embodiment shown in FIG. 2, common mode adjust circuit 11 comprises a transistor M0 and a transistor M1. Transistor M0 has a control terminal, a first terminal and a second terminal, wherein the control terminal of transistor M0 is coupled to the output terminal of operational amplifier AMP1 and the control terminal of transistor M2, the first terminal of transistor M0 is coupled to a power supply V5, and the second terminal of transistor M0 is coupled to input port RG1 and the non-inverting terminal of operational amplifier AMP1 through a resistor Rc1. Transistor M1 has a control terminal, a first terminal and a second terminal, wherein the control terminal of transistor M1 is coupled to the output terminal of operational amplifier AMP1 and the control terminal of transistor M2, the first terminal of transistor M1 is coupled to power supply V5, and the second terminal of transistor M1 is coupled to input port RG2 and the inverting terminal of operational amplifier AMP1 through a resistor Rc2. In the embodiment shown in FIG. 2, transistors M0 and M1 are metal oxide semiconductor field effect transistor (MOSFET).

Common mode adjust circuit 11 is configured to adaptively adjust common mode voltage VCM based on switcher output voltage SWout. In one embodiment, when switcher output voltage SWout is lower than minimum common mode voltage VCMmin, a voltage at the output terminal of operational amplifier AMP1 rises to turn ON transistors M0 and M1, adjusting current Icm1 and adjusting current Icm2 rises to lift common mode voltage VCM until there is sufficient headroom on transistor M2 to regulate output voltage Vout1. Through transistor M0 and resistor Rc1, a voltage at input port RG1 rises, and through transistor M1 and resistor Rc2, a voltage at input port RG2 rises. Common mode adjust circuit 11 lifts both the voltage at input port RG1 and the voltage at input port RG2 by a same amount, and common mode voltage VCM increases as a result. When switcher output voltage SWout is higher than minimum common mode voltage VCMmin, transistor M0 and transistor M1 are turned OFF, and both adjusting current Icm1 and adjusting current Icm2 are zero.

In one embodiment, when switching circuit 200 is disabled, switcher output voltage SWout is zero volts, differential voltage Vsense across sensing resistor Rsense is zero volts since target current IL is zero amps, and common mode adjust circuit 11 will not adjust common mode voltage VCM even with common mode voltage VCM at zero volts, that is there is no adjusting current Icm1 and adjusting current Icm2. As a result, common mode adjust circuit 11 does not force any current flowing into the output port of switching circuit 200 and does not pre-bias switcher output voltage SWout.

In the embodiment shown in FIG. 2, there are two separated common mode adjusting path, one comprising transistor M0 and resistor Rc1, the other one comprising transistor M1 and resistor Rc2, and the two separated common mode adjusting path ensures that there is no resistive attenuation path between input port RG1 and input port RG2, which prevents an input offset voltage of operational amplifier AMP1 from being multiplied, and precision of current sense circuit 20 is improved.

Figure 3:
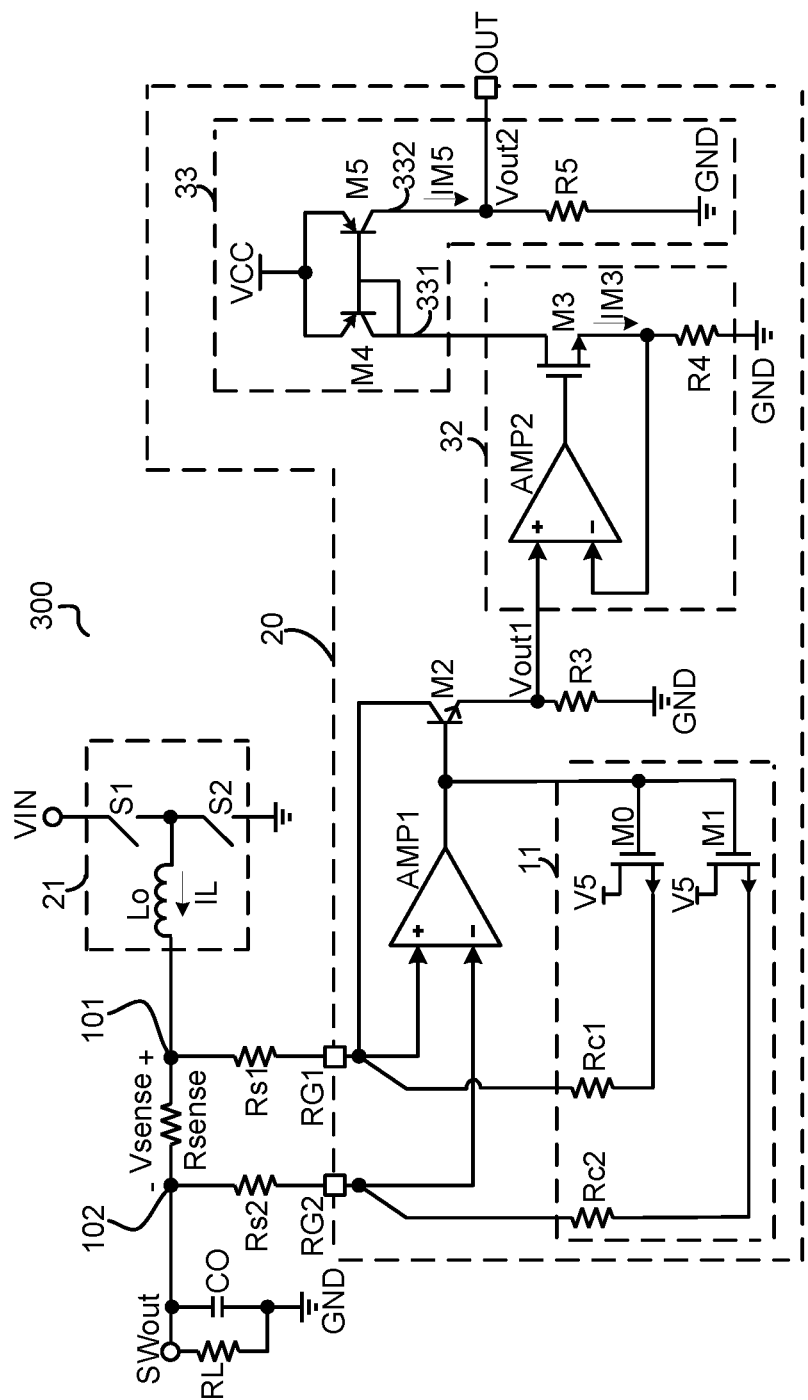
FIG. 3 schematically illustrates a switching circuit 300 according to one embodiment of the present invention.

FIG. 3 schematically illustrates a switching circuit 300 according to one embodiment of the present invention. In the embodiment shown in FIG. 3, current sense circuit 20 comprises operational amplifier AMP1, transistor M2, resistor R3, common mode adjust circuit 11, a current following stage 32, and an output stage 33.

Output voltage Vout1 must be lower than the voltage at input port RG1 per limitation of transistor M2. As a result, magnification of Vout1/Vsense is very limited, especially when switcher output voltage SWout is low. In the embodiment shown in FIG. 3, current following stage 32 and output stage 33 are employed to further amplify differential voltage Vsense across sensing resistor Rsense.

Current following stage 32 comprises an operational amplifier AMP2, a transistor M3, and a resistor R4. Operational amplifier AMP2 has a non-inverting terminal coupled to the second terminal of transistor M2, an inverting terminal, and an output terminal. Transistor M3 has a control terminal coupled to the output terminal of operational amplifier AMP2, a first terminal coupled to output stage 33, and a second terminal coupled to the inverting terminal of operational amplifier AMP2. Resistor R4 has a first terminal coupled to the second terminal of transistor M3, and a second terminal coupled to reference ground GND. Operational amplifier AMP2 is employed to accurately mirror a current flowing through resistor R3 and provide a current IM3 flowing through resistor R4 even when output voltage Vout1 is very small, for example when output voltage Vout1 is as small as 500 mV. Current IM3 is expressed as:

$$IM3 = Vout1/R4 = R3*IL*Rsense/(Rs1*R4) \quad (2)$$

Output stage 33 comprises a current mirror and an output resistor R5. The current mirror comprises a transistor M4 and a transistor M5. The current mirror has an input terminal 331 coupled to the first terminal of transistor M3 to receive current IM3, an output terminal 332 configured to provide a mirrored current IM5, and a bias terminal coupled to a power supply VCC. Current IM5 is expressed as:

$$IM5 = IM3*K1 \quad (3)$$

Where K1 is a current ratio of the current mirror.

Output resistor R5 has a first terminal coupled to the output terminal 332 of the current mirror and output port OUT, and a second terminal coupled to reference ground GND. Output resistor R5 is configured to convert current IM5 to output voltage Vout2 at output port OUT. That is current sense circuit 20 is configured to amplify differential voltage Vsense across sensing resistor Rsense and provide output voltage Vout2 at output port OUT in response to target current IL. Output voltage Vout2 is expressed as:

$$Vout2 = IM5*R5 \quad (4)$$

Based on equations (1)-(4), amplification Vout2/Vsense can be expressed as:

$$Vout2/Vsense = K1*R3*R5/(R4*Rs1) \quad (5)$$

Figure 4:
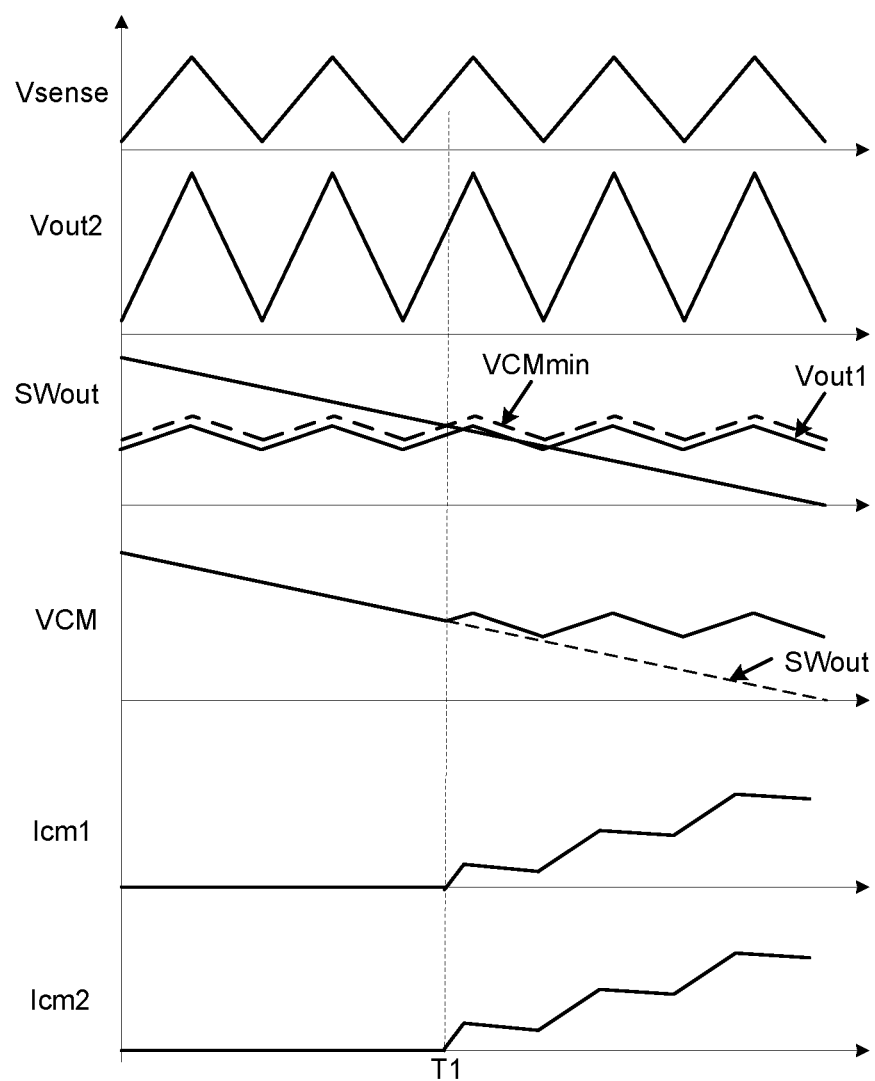
FIG. 4 illustrates waveforms of switching circuit 300 as shown in FIG. 3 with common mode adjusting according to one embodiment of the present invention.

FIG. 4 illustrates waveforms of switching circuit 300 with common mode voltage adjusting according to one embodiment of the present invention. From top to bottom, FIG. 4 shows differential voltage Vsense, output voltage Vout2, switcher output voltage SWout, common mode voltage VCM, adjusting current Icm1, and adjusting current Icm2.

In the embodiment shown in FIG. 4, differential voltage Vsense is a repeated triangle waveform as one example. Current sense circuit 20 senses differential voltage Vsense and provides output voltage Vout2 in response to differential voltage Vsense. Before time T1 as shown in FIG. 4, switcher output voltage SWout is higher than minimum common mode voltage VCMmin, both adjusting current Icm1 and adjusting current Icm2 keep zero amps, and common mode adjust circuit 11 does not adjust common mode voltage VCM, as a result, common mode voltage VCM follows switcher output voltage SWout. When switcher output voltage SWout is lower than minimum common mode voltage VCMmin at time T1, common mode voltage VCM does not follow switcher output voltage SWout, current sense circuit 20 is configured to lift common mode voltage VCM by providing adjusting current Icm1 to input port RG1 and providing adjusting current Icm2 to input port RG2. Both adjusting current Icm1 and adjusting current Icm2 increase with decreasing of switcher output voltage SWout to adaptively adjust common mode voltage VCM. In one embodiment, adjusting current Icm1 and adjusting current Icm2 respectively has a ripple corresponding to a ripple on differential voltage Vsense.

Continuing with FIG. 4, minimum common mode voltage VCMmin is dependent on differential voltage Vsense. In one embodiment, minimum common mode voltage VCMmin is expressed as:

$$VCMmin = Vsense * R3/Rs1 + Vhead \quad (6)$$

Where Vsense*R3/Rs1 is an expected value of output voltage Vout1, that is a voltage across resistor R3 when transistor M2 is normally regulated, and Vhead is a headroom voltage across transistor M2 for normally regulated. That is, when switcher output voltage SWout is lower than Vsense*R3/Rs1+Vhead, common mode adjust circuit 11 is configured to adaptively adjust common mode voltage VCM, and common mode voltage VCM will follow minimum common mode voltage VCMmin.

And as shown in FIG. 4, current sense circuit 20 can provide correct output voltage Vout2 during full range of switcher output voltage SWout, even when switcher output voltage SWout is as low as zero volts.

Figure 5:
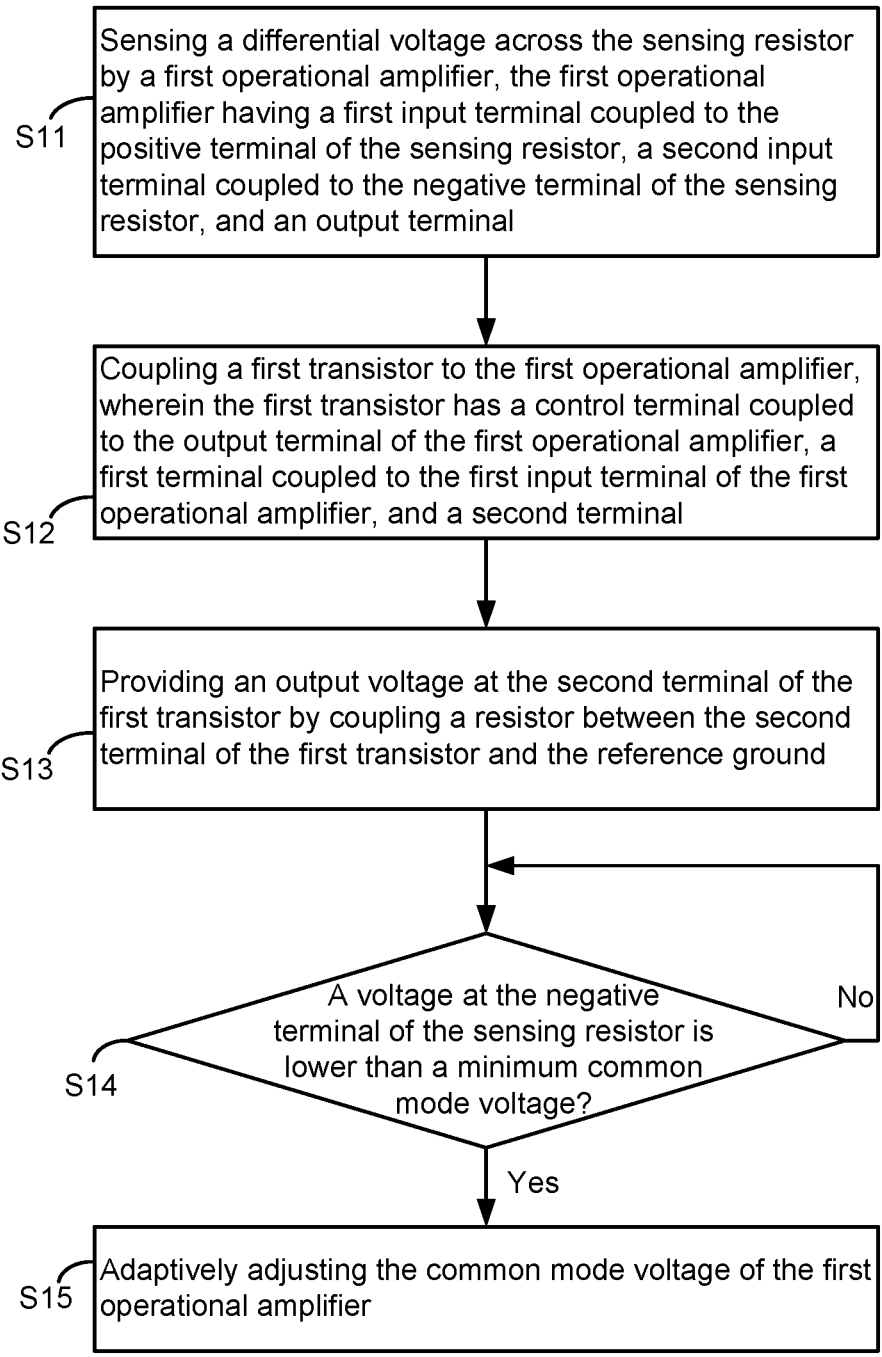
FIG. 5 shows a flow chart illustrating a method for current sensing according to an embodiment of the present invention.

FIG. 5 shows a flow chart illustrating a method for sensing a target current flowing through a sensing resistor, wherein the sensing resistor has a positive terminal and a negative terminal. The method comprises steps S11-S15.

At step S11, sensing a differential voltage across the sensing resistor by a first operational amplifier, the first operational amplifier having a first input terminal coupled to the positive terminal of the sensing resistor, a second input terminal coupled to the negative terminal of the sensing resistor, and an output terminal. The first input terminal and the second input terminal of the first operational amplifier has a common mode voltage with respect to a reference ground.

At step S12, coupling a first transistor to the first operational amplifier, wherein the first transistor has a control terminal coupled to the output terminal of the first operational amplifier, a first terminal coupled to the first input terminal of the first operational amplifier, and a second terminal.

At step S13, providing an output voltage at the second terminal of the first transistor by coupling a resistor between the second terminal of the first transistor and the reference ground.

At step S14, judging if a voltage at the negative terminal of the sensing resistor is lower than a minimum common mode voltage? If yes, then go to step S15. The minimum common mode voltage varies with the differential voltage across the sensing resistor. In one embodiment, the minimum common mode voltage is responsive to a voltage across the resistor when the first transistor is normally regulated.

At step S15, adaptively adjusting the common mode voltage of the first operational amplifier.

In one embodiment, adaptively adjusting the common mode voltage further comprising: providing a first adjusting current to lift a voltage at the first input terminal of the first operational amplifier, the second transistor having a first terminal, a second terminal, and a control terminal, wherein the first terminal is coupled to a power supply, the second terminal is coupled to the first input terminal of the first operational amplifier, and the control terminal is coupled to the output terminal of the first operational amplifier; and providing a second adjusting current to lift a voltage at the second input terminal of the first operational amplifier, the third transistor having a first terminal, a second terminal and a control terminal, wherein the first terminal is coupled to the power supply, the second terminal is coupled to the second input terminal of the first operational amplifier, and the control terminal is coupled to the output terminal of the first operational amplifier. In one embodiment, both of the first adjusting current and the second adjusting current increase with decreasing of the voltage at the negative terminal of the sensing resistor. In one embodiment, when the voltage at the negative terminal of the sensing resistor is higher than the minimum common mode voltage, both of the first adjusting current and the second adjusting current are zero.

Note that in the flow chart described above, the box functions may also be implemented with different order as shown in FIG. 5. For example, two successive box functions may be executed meanwhile, or sometimes the box functions may be executed in reverse order.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

I claim:

1. A current sense circuit for sensing a target current flowing through a sensing resistor, wherein the sensing resistor having a positive terminal and a negative terminal, the current sense circuit comprising:

a first operational amplifier, having a first input terminal, a second input terminal and an output terminal, wherein the first input terminal is coupled to the positive terminal of the sensing resistor, and the second input terminal is coupled to the negative terminal of the sensing resistor, and wherein the first input terminal and the second input terminal of the first operational amplifier has a common mode voltage with respect to a reference ground;

a first transistor, having a first terminal, a second terminal and a control terminal, wherein the control terminal is coupled to the output terminal of the first operational amplifier, the first terminal is coupled to the first input terminal of the first operational amplifier, and the second terminal is coupled to the reference ground through a first resistor, wherein the first transistor is configured to provide a first output voltage across the first resistor in response to the target current; and a common mode adjust circuit, having an input terminal, a first output terminal and a second output terminal, wherein the input terminal is coupled to the output terminal of the first operational amplifier and the control terminal of the first transistor, the first output terminal is coupled to the first input terminal of the first operational amplifier, and the second output terminal is coupled to the second input terminal of the first operational amplifier, wherein the common mode adjust circuit is configured to adaptively adjust the common mode voltage.

2. The current sense circuit of claim 1, wherein the common mode adjust circuit further comprises:
a second transistor, having a control terminal, a first terminal and a second terminal, wherein the control terminal is coupled to the output terminal of the first operational amplifier and the control terminal of the first transistor, the first terminal is coupled to a power supply, and the second terminal is coupled to the first input terminal of the first operational amplifier; and
a third transistor, having a control terminal, a first terminal and a second terminal, wherein the control terminal is coupled to the output terminal of the first operational amplifier and the control terminal of the first transistor, the first terminal is coupled to the power supply, and the second terminal is coupled to the second input terminal of the first operational amplifier.

3. The current sense circuit of claim 1, wherein when a voltage at the negative terminal of the sensing resistor is lower than a minimum common mode voltage, the common mode adjust circuit begins to adjust the common mode voltage by providing a first adjusting current at the first output terminal of the common mode adjust circuit, and providing a second adjusting current at the second output terminal of the common mode adjust circuit.

4. The current sense circuit of claim 1, further comprising:
a second operational amplifier, having a first input terminal, a second input terminal and an output terminal, wherein the first input terminal is coupled to the second terminal of the first transistor;
a fourth transistor, having a control terminal, a first terminal and a second terminal, wherein the control terminal is coupled to the output terminal of the second operational amplifier, and the second terminal is coupled to the second input terminal of the second operational amplifier; and
a second resistor, coupled between the second terminal of the fourth transistor and the reference ground.

5. The current sense circuit of claim 3, wherein both of the first adjusting current and the second adjusting current increase with decreasing of the voltage at the negative terminal of the sensing resistor.

6. The current sense circuit of claim 3, wherein the minimum common mode voltage is responsive to a voltage across the first resistor when the first transistor is normally regulated.

7. The current sense circuit of claim 4, further comprising:
a current mirror, having an input terminal coupled to the first terminal of the fourth transistor, and an output terminal configured to provide a mirrored current, wherein the mirrored current is mirrored from a current flowing through the first terminal and the second terminal of the fourth transistor; and
an output resistor, coupled between the output terminal of the current mirror and the reference ground; and wherein
the current sense circuit is configured to provide a second output voltage across the output resistor in response to the target current.

8. A switching circuit having an input port and an output port, wherein the output port is configured to provide a switcher output voltage, the switching circuit comprising:
a switch, coupled between the input port and the output port, and the switch is configured to be turned ON and turned OFF to regulate the switcher output voltage;
a sensing resistor, having a positive terminal and a negative terminal, wherein the positive terminal is coupled to the switch, and the negative terminal is coupled to the output port, a target current flows through the sensing resistor from the positive terminal to the negative terminal; and
a current sense circuit, having a first input port, a second input port and an output port, wherein the first input port is coupled to the positive terminal of the sensing resistor, the second input port is coupled to the negative terminal of the sensing resistor, and the current sense circuit is configured to amplify a differential voltage across the sensing resistor and provide an output voltage at the output port of the current sense circuit in response to the target current, wherein the first input port and the second input port of the current sense circuit has a common mode voltage with respect to a reference ground, and wherein the current sense circuit is configured to adaptively adjust the common mode voltage based on the switcher output voltage; wherein when the switcher output voltage is lower than a minimum common mode voltage, the current sense circuit is configured to lift the common mode voltage by generating a first adjusting current to the first input port of the current sense circuit and generating a second adjusting current to the second input port of the current sense circuit.

9. The switching circuit of claim 8, wherein the current sense circuit further comprises:
a first operational amplifier, having a first input terminal, a second input terminal and an output terminal, wherein the first input terminal is coupled to the positive terminal of the sensing resistor, and the second input terminal is coupled to the negative terminal of the sensing resistor;
a first transistor, having a control terminal, a first terminal and a second terminal, wherein the control terminal is coupled to the output terminal of the first operational amplifier, the first terminal is coupled to the first input terminal of the first operational amplifier, and the second terminal is coupled to the reference ground; and
a common mode adjust circuit, having an input terminal, a first output terminal and a second output terminal, wherein the input terminal is coupled to the output terminal of the first operational amplifier and the control terminal of the first transistor, the first output terminal is coupled to the first input terminal of the first operational amplifier, and the second output terminal is coupled to the second input terminal of the first operational amplifier.

10. The switching circuit of claim 8, further comprising:
a second operational amplifier, having a first input terminal, a second input terminal and an output terminal, wherein the first input terminal is coupled to the second terminal of the first transistor; and
a fourth transistor, having a control terminal, a first terminal and a second terminal, wherein the control terminal is coupled to the output terminal of the second operational amplifier, the second terminal is coupled to the second input terminal of the second operational amplifier.

11. The switching circuit of claim 9, wherein the common mode adjust circuit further comprises:
- a second transistor, having a control terminal, a first terminal and a second terminal, wherein the control terminal is coupled to the output terminal of the first operational amplifier, the first terminal is coupled to a power supply, and the second terminal is coupled to the first input terminal of the first operational amplifier; and
- a third transistor, having a control terminal, a first terminal and a second terminal, wherein the control terminal is coupled to the output terminal of the first operational amplifier, the first terminal is coupled to the power supply, and the second terminal is coupled to the second input terminal of the first operational amplifier.

12. The switching circuit of claim 10, further comprising:
- a current mirror, having an input terminal coupled to the first terminal of the fourth transistor, and an output terminal configured to provide a mirrored current, wherein the mirrored current is mirrored from a current flowing through the first terminal and the second terminal of the fourth transistor; and
- an output resistor, coupled between the output terminal of the current mirror and the reference ground; and wherein
  - the current sense circuit is configured to provide the output voltage across the output resistor in response to the target current.

13. A method for sensing a target current flowing through a sensing resistor, wherein the sensing resistor has a positive terminal and a negative terminal, the method comprising:
- sensing a differential voltage across the sensing resistor by a first operational amplifier, the first operational amplifier having a first input terminal coupled to the positive terminal of the sensing resistor, a second input terminal coupled to the negative terminal of the sensing resistor, and an output terminal, wherein the first input terminal and the second input terminal of the first operational amplifier has a common mode voltage with respect to a reference ground;
- coupling a first transistor to the first operational amplifier, the first transistor having a control terminal, a first terminal and a second terminal, wherein the control terminal is coupled to the output terminal of the first operational amplifier, and the first terminal is coupled to the first input terminal of the first operational amplifier;
- providing an output voltage at the second terminal of the first transistor in response to the target current; and
- adaptively adjusting the common mode voltage when a voltage at the negative terminal of the sensing resistor is lower than a minimum common mode voltage, wherein the minimum common mode voltage varies with the differential voltage across the sensing resistor.

14. The method of claim 13, wherein adaptively adjusting the common mode voltage further comprises lifting the common mode voltage until the first transistor can be normally regulated.

15. The method of claim 13, wherein the minimum common mode voltage is responsive to an expected value of the output voltage.

16. The method of claim 13, further comprising:
- providing a first adjusting current to the first input terminal of the first operational amplifier through a second transistor, the second transistor having a first terminal, a second terminal and a control terminal, wherein the first terminal is coupled to a power supply, the second terminal is coupled to the first input terminal of the first operational amplifier, and the control terminal is coupled to the output terminal of the first operational amplifier; and
- providing a second adjusting current to the second input terminal of the first operational amplifier through a third transistor, the third transistor having a first terminal, a second terminal and a control terminal, wherein the first terminal is coupled to the power supply, the second terminal is coupled to the second input terminal of the first operational amplifier, and the control terminal is coupled to the output terminal of the first operational amplifier.

17. The method of claim 16, wherein both of the first adjusting current and the second adjusting current increase with decreasing of the voltage at the negative terminal of the sensing resistor.

18. The method of claim 16, wherein when the voltage at the negative terminal of the sensing resistor is higher than the minimum common mode voltage, both of the first adjusting current and the second adjusting current are zero.

* * * * *